United States Patent [19]

Banik

[11] Patent Number: 5,656,962
[45] Date of Patent: Aug. 12, 1997

[54] MASTER-SLAVE FLIP-FLOP CIRCUIT WITH BYPASS

[75] Inventor: Jashojiban Banik, Aloha, Oreg.

[73] Assignee: Intel Corporation, Santa Clara, Calif.

[21] Appl. No.: 768,792

[22] Filed: Dec. 18, 1996

Related U.S. Application Data

[63] Continuation of Ser. No. 595,188, Feb. 1, 1996, abandoned, which is a continuation of Ser. No. 347,805, Nov. 30, 1994, abandoned.

[51] Int. Cl.$^6$ .......................... H03K 3/037; H03K 3/356
[52] U.S. Cl. .................. 327/202; 327/225; 327/208
[58] Field of Search ...................... 327/202, 203, 327/208, 210, 211, 212, 214, 215, 218, 219, 225, 407; 377/117, 115, 116

[56] References Cited

U.S. PATENT DOCUMENTS

| | | | |
|---|---|---|---|
| 4,446,390 | 5/1984 | Alaspa | 327/407 |
| 4,593,390 | 6/1986 | Hildebrand et al. | 327/407 |
| 4,970,407 | 11/1990 | Patchen | 327/203 |
| 5,227,674 | 7/1993 | Takahashi et al. | 327/202 |
| 5,237,573 | 8/1993 | Dhuey et al. | 327/407 |
| 5,280,203 | 1/1994 | Hung et al. | 327/202 |
| 5,311,070 | 5/1994 | Dooley | 327/208 |
| 5,321,399 | 6/1994 | Notani et al. | 327/203 |
| 5,459,421 | 10/1995 | Shaw | 327/203 |
| 5,497,114 | 3/1996 | Shimozono et al. | 327/211 |

FOREIGN PATENT DOCUMENTS

| | | | |
|---|---|---|---|
| 3443788 | 6/1986 | European Pat. Off. | 327/203 |
| 2082711 | 3/1990 | Japan | 327/203 |
| 2246610 | 10/1990 | Japan | 327/203 |
| 3-101308 | 4/1991 | Japan | 327/225 |
| 4-107005 | 4/1992 | Japan | 327/225 |
| 4-250712 | 9/1992 | Japan | 327/225 |
| 5110391 | 4/1993 | Japan | 327/218 |
| 3428393 | 2/1986 | Sweden | 327/203 |

OTHER PUBLICATIONS

"High–Speed CMOS Circuit Technique", IEEE Journal of Solid–State Cirucuit, Jiren Yuan & Christer Svensson, vol. 24, No. 1, Feb. 1989, pp. 62–70.

*Primary Examiner*—Timothy P. Callahan
*Assistant Examiner*—Eunja Shin
*Attorney, Agent, or Firm*—Blakely, Sokoloff, Taylor & Zafman

[57] ABSTRACT

A master-slave flip-flop circuit is described. The flip-flop circuit comprises of a master circuit capable of storing and transmitting a signal and a slave circuit capable of storing and transmitting the signal. The flip-flop circuit also comprises of a bypass circuit capable of transmitting the signal to an output of the flip-flop.

13 Claims, 8 Drawing Sheets

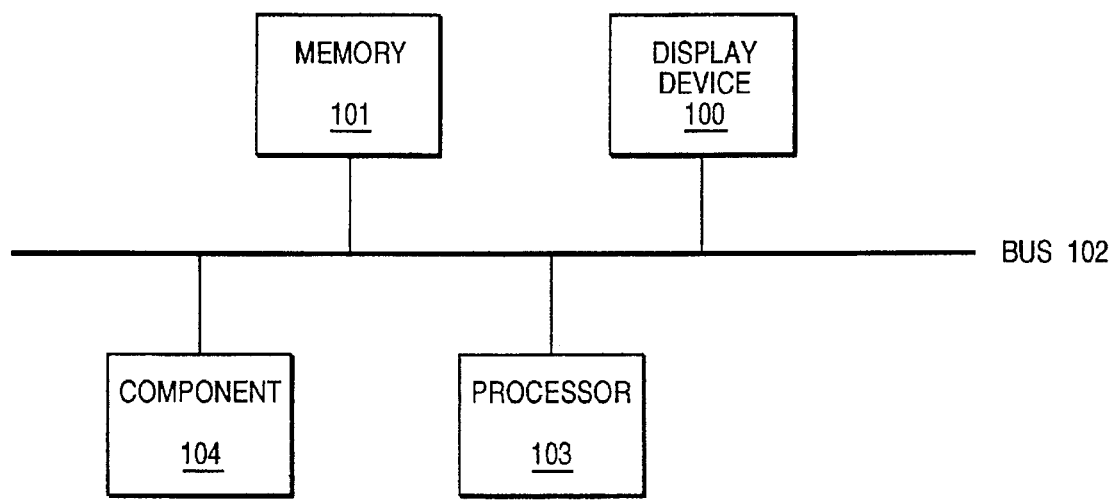
FIG_1
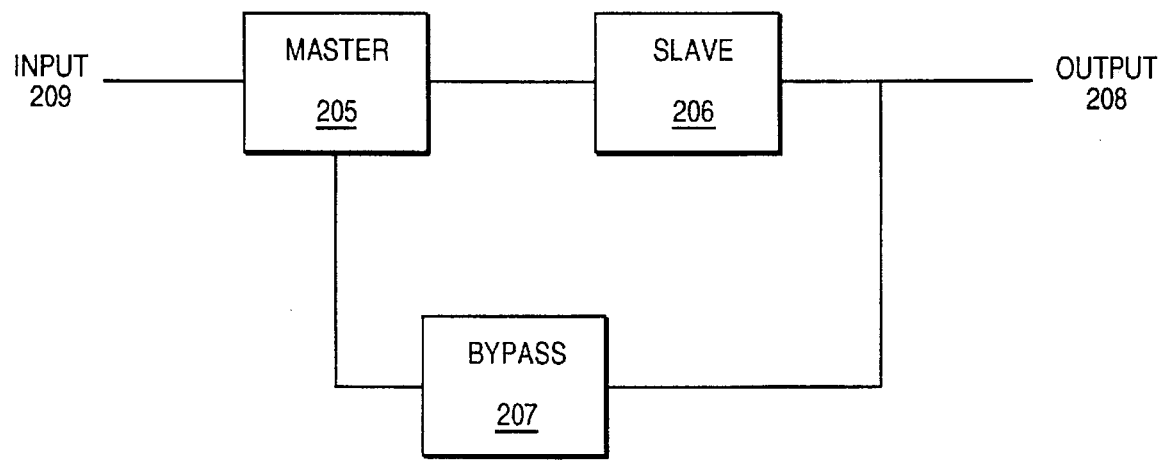
FIG_2

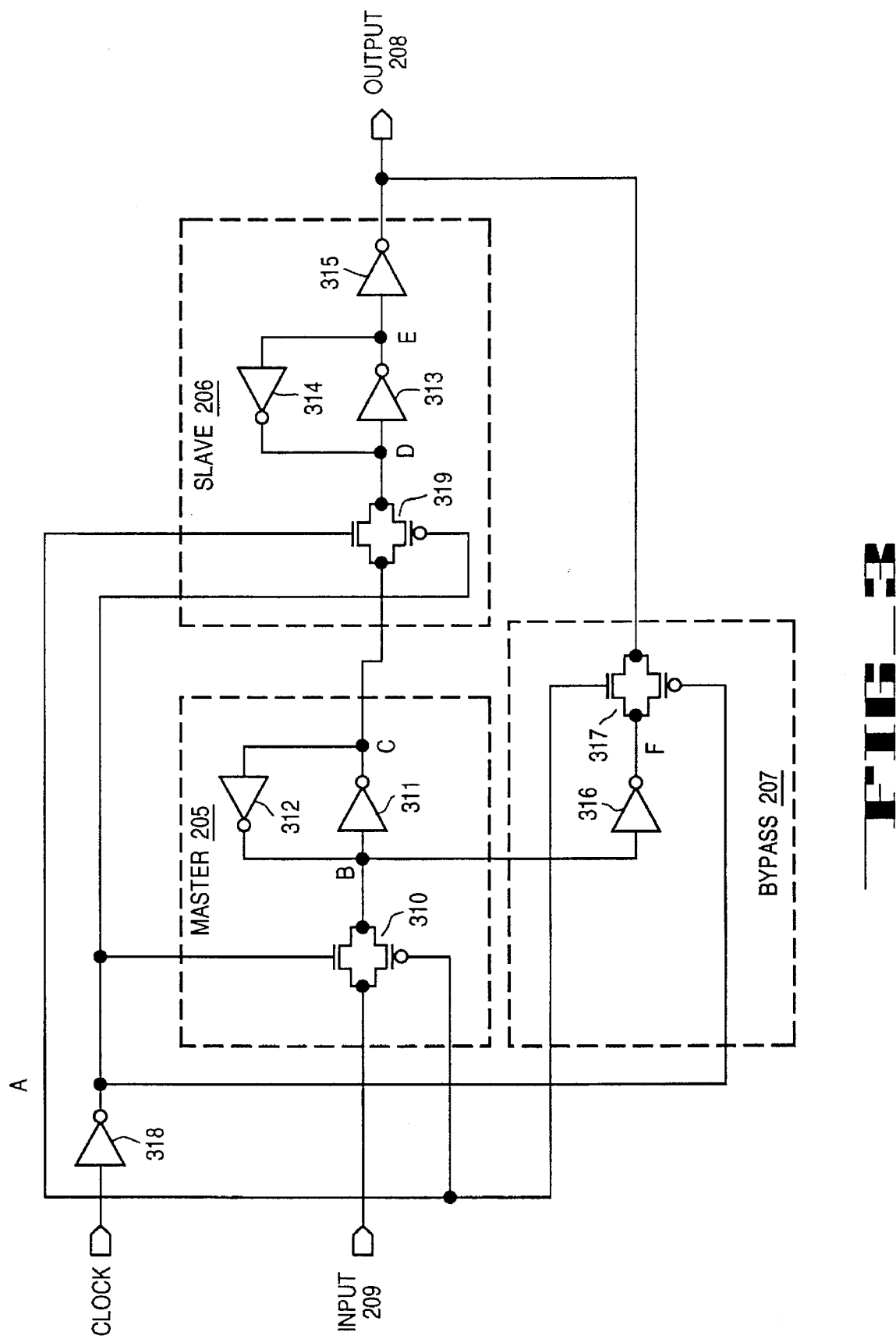
FIG_3

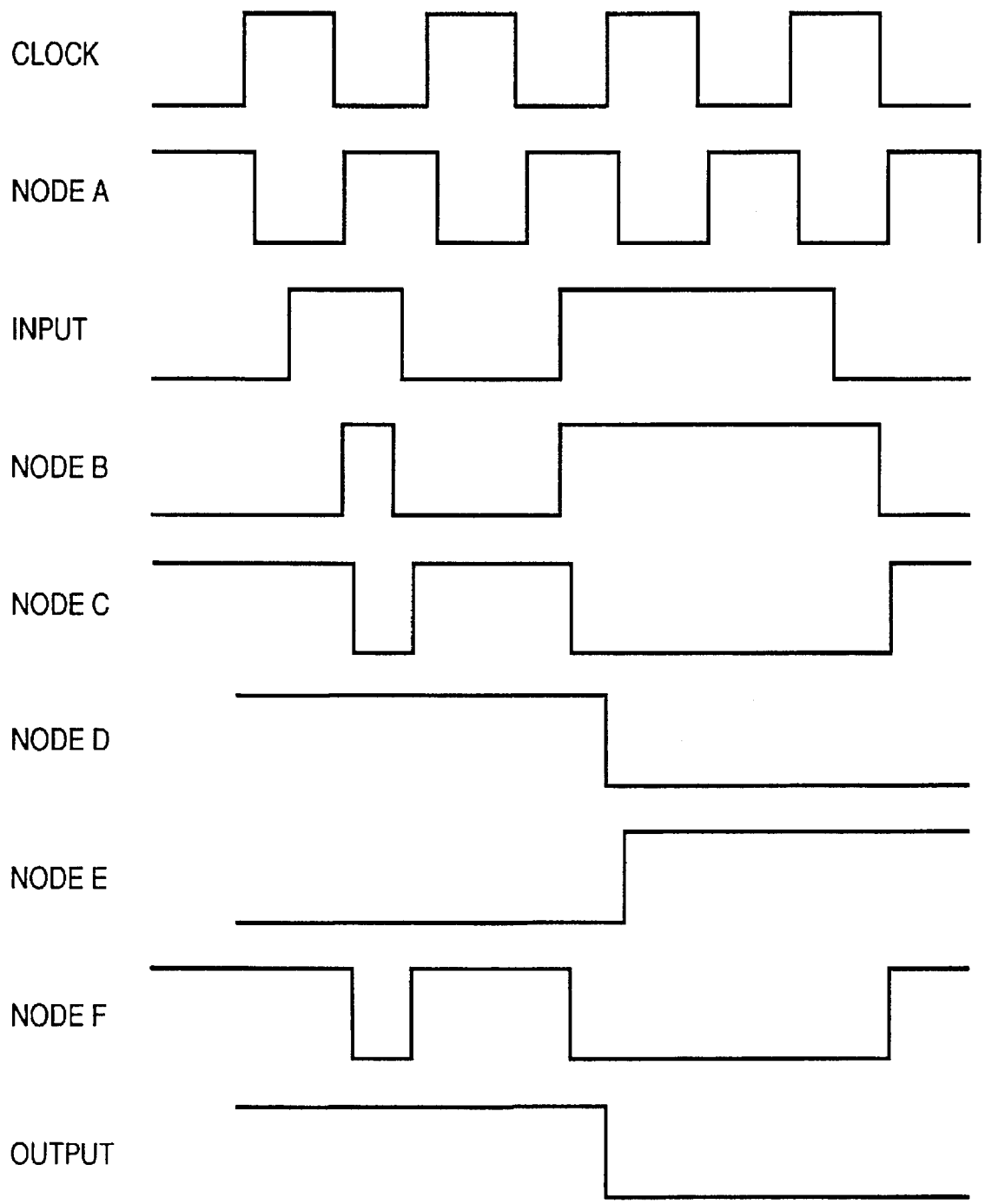
FIG_4

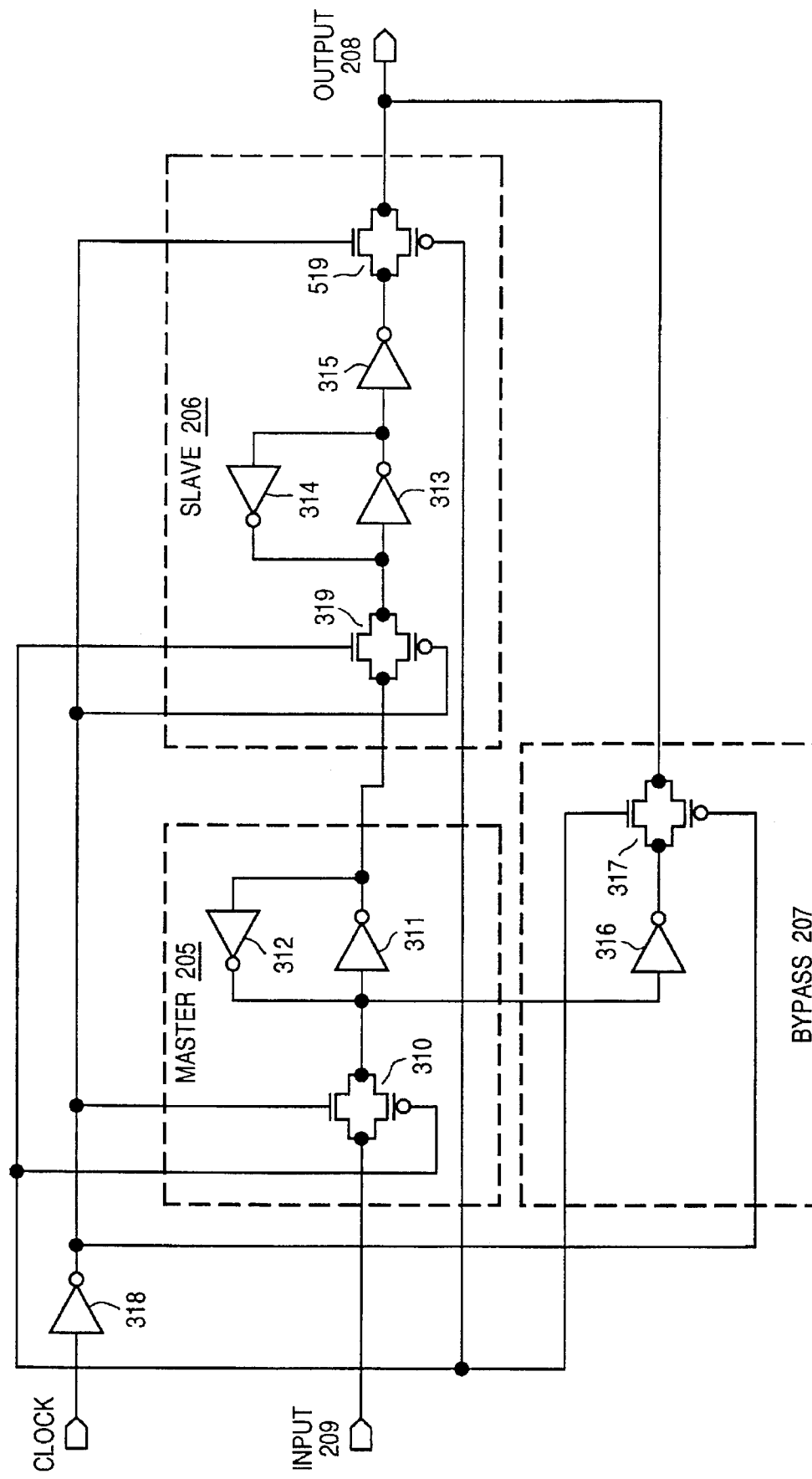
FIG_5

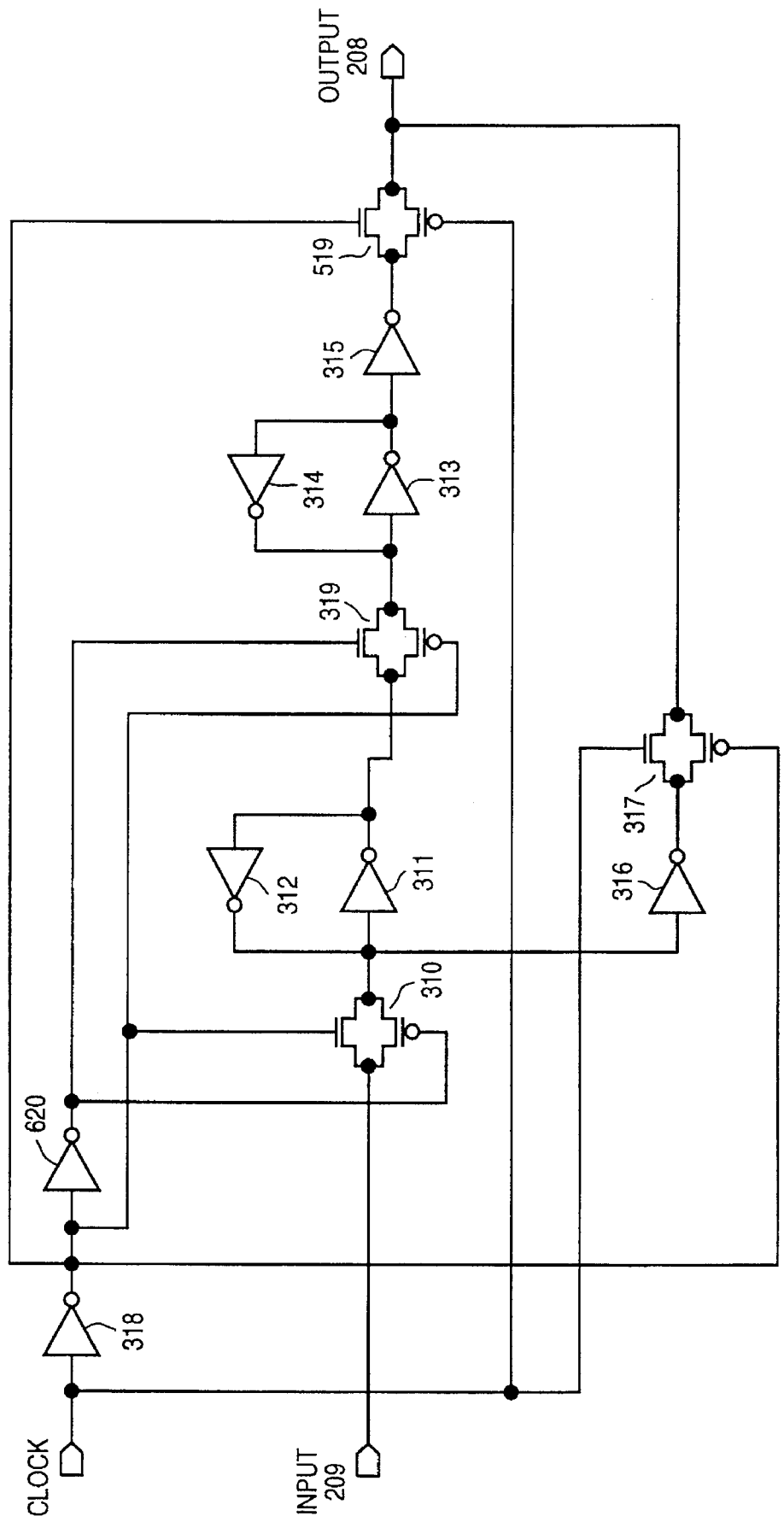
FIG._6

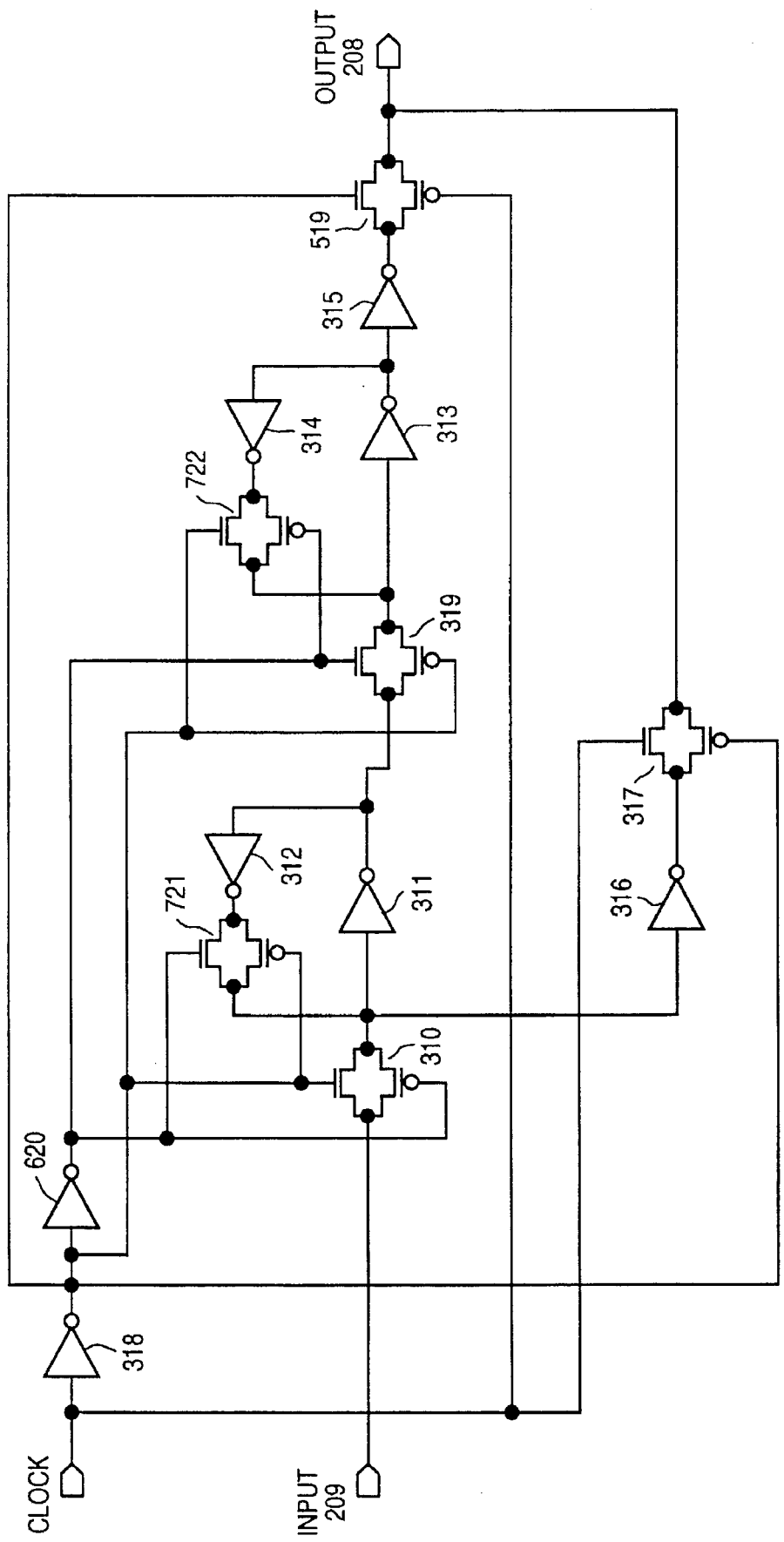
FIG_7

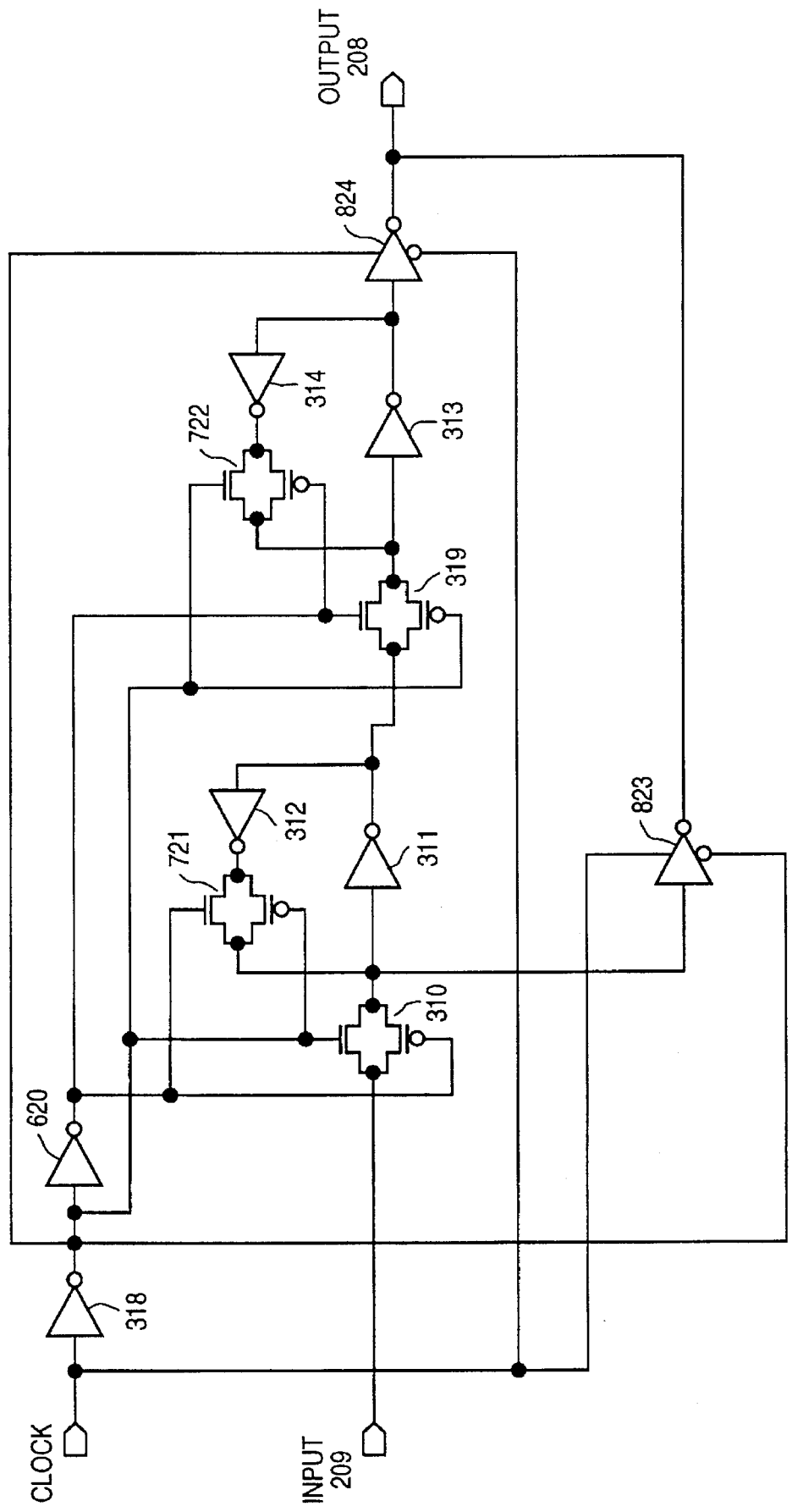
FIG_X

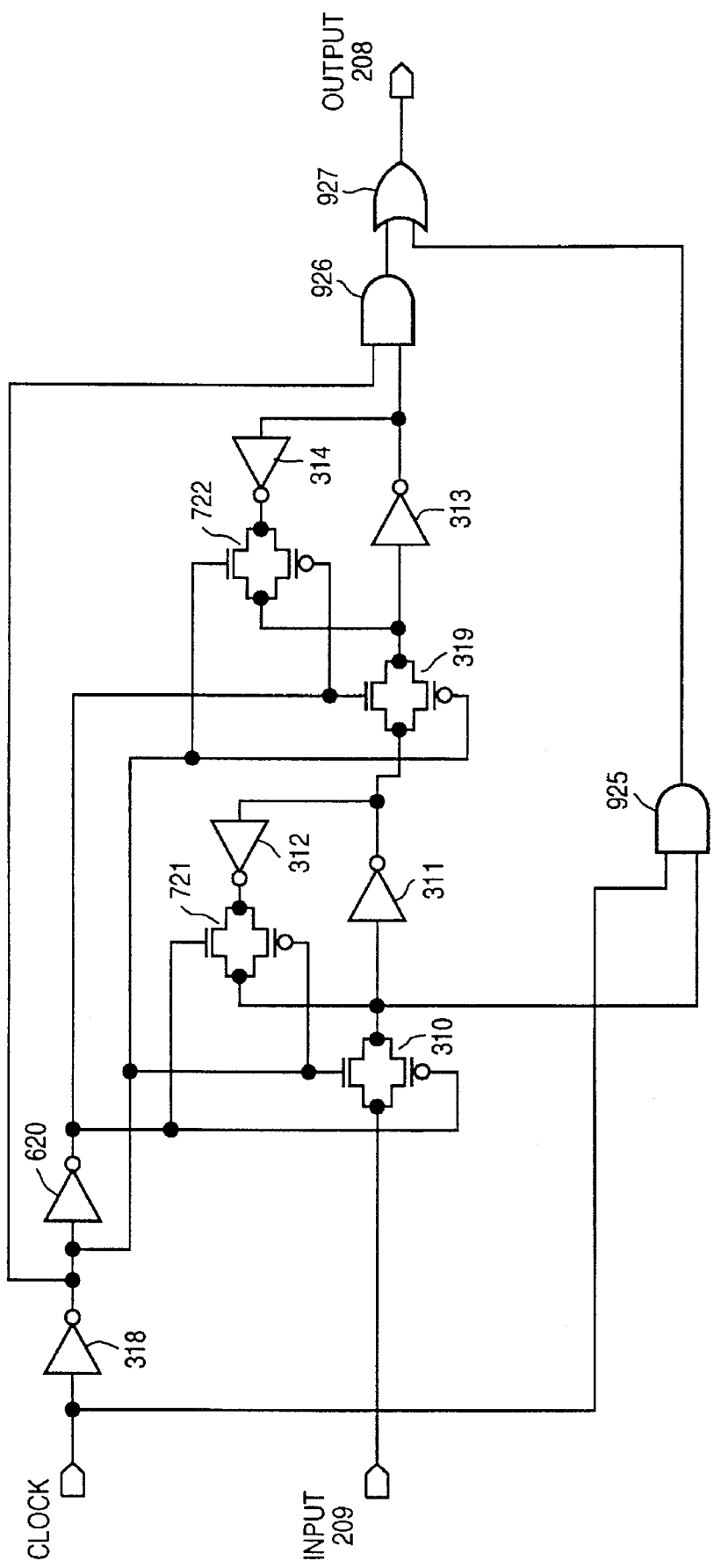
FIG_9

MASTER-SLAVE FLIP-FLOP CIRCUIT WITH BYPASS

This is a continuation of application Ser. No. 08/595,188, filed Feb. 1, 1996, now abandoned, which is a continuation of application Ser. No. 08/347,805, filed Nov. 30, 1994, now abandoned.

FIELD OF THE INVENTION

The present invention relates to the field of semiconductor devices. More particularly, the present invention relates to the design of flip-flop circuitry.

BACKGROUND OF THE INVENTION

Flip-flop circuits are used in semiconductor devices to maintain a binary state until directed by an input signal to switch states. A variation of the basic flip-flop circuit, the docked flip-flop circuit responds to input levels in response to a clock signal. Used in this manner, the docked flip-flop circuit acts as a sampling device which only reads the information off of its input line when directed to do so by the docking circuit. After reading the information, the circuit stores the information and outputs it on the output line. In all other instances of time, the circuit will not respond to input signals and will remain unchanged during variations of signal states in the input line.

Despite their usefulness, typical flip-flops have many shortcomings. One such typical flip-flop is the complimentary metal oxide semiconductor field effect transistor (CMOS) static master-slave flip-flop. It consists of two stages—the master and the slave. A data input to this conventional type of flip-flop has to travel through both the master and the slave to come to the output causing a large input to output flip-flop delay. In fast circuits, this delay is minimized by making the devices in the path large which in turn causes the flip-flop circuit to occupy a relatively large amount of space.

Thus, what is needed is a faster flip-flop that occupies less space.

SUMMARY OF THE INVENTION

A novel flip-flop is described. The flip-flop receives an input signal through an input, stores the input signal in a first storage device, transmits the input signal from the first storage device, stores the input signal in a second storage device, transmits the input signal to an output from the second storage device, transmits the input signal from the first storage device to a bypass device, and transmits the input signal to the output from the bypass device.

Under an alternative embodiment, the flip-flop comprises a master circuit capable of storing an input signal and capable of transmitting the input signal. The flip-flop also comprises a slave circuit coupled to the master circuit capable of receiving the input signal from the master circuit, capable of storing the input signal, and capable of transmitting the input signal. In addition, the flip-flop comprises a bypass circuit coupled to the master circuit capable of receiving the first signal from the master circuit and capable of transmitting the input signal.

Under yet another embodiment, the flip-flip circuit further comprises a trigger device coupled to the bypass circuit, wherein the trigger device is capable of transmitting a first trigger signal to the bypass circuit, wherein the trigger device is also capable of transmitting a second trigger signal to the bypass circuit. The bypass circuit is capable of receiving the first trigger signal from the trigger device and is capable of responding to the first trigger signal by receiving the input signal from the master circuit and is capable of transmitting the input signal received from the master circuit. The bypass circuit is capable of receiving the second trigger signal from the trigger device and is capable of responding to the second trigger signal by suppressing the input signal.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 illustrates in block diagram form a computer system of one embodiment of the present invention.

FIG. 2 illustrates in block diagram form a circuit of one embodiment of the present invention.

FIG. 3 illustrates in logic diagram form a second embodiment of the present invention.

FIG. 4 illustrates in timing diagram form the operation of the circuit of FIG. 3.

FIG. 5 illustrates in logic diagram form a third embodiment of the present invention.

FIG. 6 illustrates in logic diagram form a fourth embodiment of the present invention.

FIG. 7 illustrates, in logic diagram form a fifth embodiment of the present a invention.

FIG. 8 illustrates in logic diagram form a sixth embodiment of the present invention.

FIG. 9 illustrates in logic diagram form a seventh embodiment of the present invention.

DETAILED DESCRIPTION

A novel master-slave flip-flop is described. In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

FIG. 1 illustrates in block diagram form a computer system of one embodiment of the present invention. The computer system comprises display device 100, memory 101, bus 102, processor 103 and component 104. In this computer system, display device 100 can be a television set, a computer monitor, flat panel display or other display device. Memory 101 can be a random access memory (RAM) or other memory device. Bus 102 can be an Industry Standard Architecture (ISA) bus, an Extended Industry Standard Architecture (EISA) bus or a Peripheral Components Interconnect (PCI) bus. Processor 103 can be a microprocessor. Component 104 can be a bus controller, a Direct Memory Access (DMA) controller or a chipset component. Display device 100 is coupled to processor 103. Memory 101 is coupled to bus 102 and bus 102 in turn is coupled to processor 103 and component 104. In this manner, memory 101 is in communication with processor 103 and component 104. Moreover, processor 103 is in communication with memory 101 and component 104. Finally, component 104 is in communication with memory 101 and processor 103.

FIG. 2 illustrates in block diagram form a circuit of one embodiment of the present invention. The circuit comprises master portion 205, slave portion 206, bypass 207, out-put 208 and input 209. Master portion 205 is coupled to slave portion 206 and in this example, they form a master-slave flip-flop. Slave portion 206 is coupled to output 208 and master portion 205 is coupled to input 209. Bypass 207 is also coupled to master portion 205 and is also coupled to output 208. Input 209 is capable of receiving an input signal from another circuit or from another component. Master portion 205 stores the signal received by input 209. Master portion 205 transmits the input signal to slave portion 206. The input signal transmitted by master portion 205 can be a second signal which corresponds to the input signal. Master portion 205 also transmits the input signal to bypass 207. Slave portion 206 receives the input or second signal from master portion 205 and stores the signal. Slave portion 206 transmits the input signal to output 208. The input signal transmitted by slave portion 206 can be a third signal which corresponds to the signal received by slave portion 206. Bypass 207 receives the input signal from master portion 205 and transmits the input signal to output 208. The input signal transmitted by bypass 207 can be a fourth signal corresponding to the input signal from master portion 205.

In this embodiment, bypass 207 does not store the signal from master portion 205 and thus, it can transmit a signal to output 208 faster than slave portion 206 which does store the signal from master portion 205. In this manner, bypass 207 allows the circuit of this embodiment to output a signal faster in response to an input signal. The speed of the circuit only depends on the speed of master portion 205 and bypass 207, instead of the speed of master portion 205 and slave portion 206 as in conventional flip-flop circuits. Slave portion 206 in this embodiment, is only used for storage purposes. Because the speed of slave portion 206 is not critical to the speed of the circuit, a slower device can be utilized for slave portion 206. The slower speed requirements of slave portion 206 allows designers to utilize a device with smaller transistors thus saving area on a semiconductor chip. In addition, the slower speed requirements of slave portion 206 also allows designers to utilize a device consuming less power for slave portion 206. In this embodiment, the second signal is inverted from the input signal, the third signal is inverted from the second signal and the fourth signal is inverted from the first signal. Thus, the third signal and the fourth signal have the same signal states. In alternative embodiments, the second signal may or may not be inverted to the input signal, the third signal may or may not be inverted from the second signal and the fourth signal may or may not be inverted from the input signal. It will be appreciated that bypass 207 can be utilized with a static master-slave flip-flop circuit or a dynamic master-slave flip-flop circuit. Bypass 207 can also be utilized on other types of flip-flop circuits. Moreover, bypass 207 can be utilized in other circuits where the bypass feature results in speed, area, or power improvements.

FIG. 3 illustrates in logic diagram form a second embodiment of the present invention. In this embodiment, master portion 205 and slave portion 206 are both static devices. Master portion 205 comprises pass gate 310, inverter 311 and inverter 312. Pass gate 310 is coupled to input 209 on one end and coupled to inverter 311 and inverter 312 on the other end. Inverter 311 is coupled to inverter 312 and is also coupled to slave portion 206. Inverter 311 and inverter 312 are positioned front-to-back. They together perform the storage function of master portion 205. Slave portion 206 comprises pass gate 319, inverter 313, inverter 314 and inverter 315. Pass gate 319 is coupled to master portion 205 on one end and is coupled to both inverter 313 and inverter 314 on the other end. Inverter 313 is coupled to inverter 315 which is in turn coupled to output 208. Like the inverters in master portion 205, inverter 313 and inverter 314 are positioned front-to-back. They also perform the storage function for slave portion 206. Bypass 207 comprises inverter 316 and pass gate 317. Inverter 316 is coupled to master portion 205 on one end and is coupled to pass gate 317 on the other end. Pass gate 317 is coupled to inverter 316 on one end and is coupled to output 208 on the other end. In this embodiment, bypass 207 is coupled to the beginning of master portion 205 before inverter 311. Slave portion 206 on the other hand, is coupled to the end of master portion 205 after inverter 311. As a consequence, when compared to slave portion 206, bypass 207 avoids the gate delays associated with inverter 311, pass gate 319, inverter 313 and inverter 315. This feature allows bypass 207 to transmit a signal to output 208 faster than slave portion 206. In addition, bypass 207 does not have storage functions and consequently has more simplified circuitry than that of slave portion 206. Bypass 207 only has two elements in this embodiment, inverter 316 and pass gate 317. As a consequence, bypass 207 avoids delays associated with contention of front-to-back inverters used for storage functions in slave portion 206.

In this embodiment, pass gate 310 of master portion 205, pass gate 319 of slave portion 206, and pass gate 317 of bypass 207 are all coupled to a trigger device. When the trigger device transmits a first trigger signal, pass gate 310 responds by allowing the input signal to pass through. Front-to-back inverters 311 and 312 store the input signal passing through pass gate 310. Inverter 311 also transmits a second signal to slave portion 206 corresponding to the input signal. Concurrently with the operation of inverter 311, inverter 316 also receives the input signal passing through pass gate 310 and transmits an inverted signal corresponding to the input signal to pass gate 317. Unlike pass gate 310, pass gate 319 and pass gate 317 suppresses signal transmission in response to the first trigger signal from the trigger device. Pass gate 319 suppresses the second signal transmitted by inverter 311 while pass gate 317 suppresses the inverted signal transmitted by inverter 316.

When the trigger device transmits a second trigger signal, pass gate 310 suppresses the input signal. Front-to-back inverters 311 and 312 continue to store the previous input signal. Inverter 311 transmits a second signal to pass gate 319 of slave portion 206 corresponding to the previous input signal. Pass gates 319 and 317 on the other hand, allow signals to pass through in response to the second trigger signal. Pass gate 319 allows the second signal transmitted by inverter 311 to pass through to front-to-back inverters 313 and 314. Inverters 313 and 314 store the second signal. Inverter 313 also transmits a third signal corresponding to the second signal. Inverter 315 inverts the third signal and transmits the inverted signal to output 208. Similar to pass gate 319, pass gate 317 allows the inverted signal from inverter 316 to pass through to output 208 in response to the second trigger signal.

In this embodiment, the trigger device is coupled to inverter 318. Inverter 318 serves two purposes. First of all, inverter 318 allows pass gate 319 and pass gate 317 to act in opposite fashion to pass gate 310 by suppressing signals when pass gate 310 allows signals to pass through and allowing signals to pass through when pass gate 310 suppresses signals. Secondly, inverter 318 is necessary for the PMOS and NMOS transistors in pass gates 310, 319 and 317 to behave together as pass gates.

In this embodiment, the trigger device is a clock device and the trigger signals are dock signals making the circuit a synchronous circuit. It will be appreciated that the trigger device can also be a signal generating device other than a clock device making the circuit an asynchronous circuit. In addition, under an alternative embodiment, the positions of pass gate 317 and inverter 316 can be reversed. Bypass 207 will perform similarly but it will be appreciated that the circuit will be slower. The slower speed results due to the fact that the circuit experiences a gate delay associated with inverter 316 when pass gate 317 opens in response to the second trigger signal. Under the previous embodiment, the circuit does not experience a gate delay because inverter 316 inverts the input signal while the trigger device transmits a first trigger signal. Thus, when pass gate 317 opens in response to a second trigger signal, the circuit is ready to immediately transmit the inverted signal to output 208.

FIG. 4 illustrates in timing diagram form the operation of the circuit of FIG. 3. The signal labeled as CLOCK represents the clock signal transmitted to the circuit. The signal labeled as Node A represents the inverted signal transmitted by inverter 318 corresponding to the CLOCK signal. The signal labeled as INPUT represents the input signal received by input 209.

The signal labeled as Node B represents the signal at Node B in FIG. 3. The signal at Node B is the same as the INPUT signal when the CLOCK signal is in the first signal state i.e. low voltage potential. When the CLOCK signal switches to the second signal state i.e. the high voltage potential, Node B maintains the existing signal state and is unresponsive to changes in the INPUT signal. When the CLOCK signal switches back to the first signal state, Node B again has the same signal as the INPUT signal. In this manner, the front-to-back inverters 311 and 312 continue to store the existing signal when the CLOCK signal switches to the second signal state.

The signal labeled as Node C represents the signal transmitted by inverter 311. This signal is an inverted version of the signal appearing at Node B. It will be appreciated that there is a slight delay in the signal at Node C illustrating the gate delay caused by inverter 311.

The signal labeled as Node D represents the signal appearing at Node D located after pass gate 319. The signal at Node D is the same signal as the signal at Node C when the CLOCK signal is in the second signal state. When the CLOCK signal switches to the first signal state, Node D maintains the existing signal appearing at Node D when the CLOCK signal was in the second signal state. Thus, when the CLOCK signal is in the first signal state, Node D does not respond to signal changes at Node C. When the CLOCK signal switches back to the second signal state, Node D again responds to changes in the signal at Node C and has the same signal appearing at Node C. In this manner, front-to-back inverters 313 and 314 maintain the existing signal state at Node D when the CLOCK signal switches to the first signal state.

The signal labeled as Node E represents the signal transmitted by inverter 313. This signal is inverted from the signal at Node D and also has a slight delay due to the gate delay of inverter 313. The signal labeled as Node F represents the signal transmitted by inverter 316. This signal is the same signal as the signal appearing at Node C.

The signal labeled as OUTPUT represents the signal appearing at output 208. It will be appreciated that the OUTPUT signal only changes state when there is a change in the INPUT signal at the rising edge of the CLOCK signal. Thus, the circuit illustrated is a positive edge trigger device. It will be appreciated that under an alternative embodiment, a negative edge trigger device can be created by merely coupling the NMOS transistor of pass gate 310 to the CLOCK signal, coupling the PMOS transistor of pass gate 310 to the inverted CLOCK signal, coupling the NMOS transistor of pass gate 319 to the inverted CLOCK signal, coupling the PMOS transistor of pass gate 319 to the CLOCK signal, coupling the NMOS transistor of pass gate 317 to the inverted CLOCK signal, and coupling the PMOS transistor of pass gate 317 to the CLOCK signal.

It will be appreciated that the OUTPUT signal switches faster than the signal at Node E. This occurs because bypass 207 allows the circuit to avoid gate delays associated with inverter 313 and inverter 315. It will also be appreciated that when CLOCK signal is in the first signal state, slave portion 206 supplies the signal to output 208. However, when the CLOCK signal is in the second signal state, bypass 207 supplies the signal to output 208.

FIG. 5 illustrates in logic diagram form a third embodiment of the present invention. In this embodiment, slave portion 206 comprises an additional pass gate 519. Pass gate 519 behaves in the same manner as pass gate 310 in master portion 205. When the dock signal is in the first signal state, pass gate 519 allows signals from inverter 315 to pass through. On the other hand, when the dock signal is in the second signal state, pass gate 519 suppresses the signals from inverter 315. It will be appreciated that when pass gate 317 is on, pass gate 519 is off and when pass gate 317 is off, pass gate 519 is on. Because of the alternating nature of pass gates 317 and 519, the contention caused by slave portion 206 during a switch in signal states of output 208 is reduced.

FIG. 6 illustrates in logic diagram form a fourth embodiment of the present invention. In this embodiment, an additional inverter, inverter 620 is coupled to inverter 318. Inverter 620 is also coupled to pass gates 310 and 319. Because inverter 620 is coupled in series with inverter 318, inverter 620 introduces one gate delay to the switching of pass gates 310 and 319. When the trigger signal switches signal states, pass gates 317 and 519 switch first. After one gate delay from inverter 620, pass gates 310 and 319 then switch states. Without the existence of inverter 620, pass gates 310 and 319 would be coupled directed to inverter 318. In this case, there would be no gate delay between the switching of pass gates 310 and 319 when compared to the switching of pass gates 317 and 519. However, in this embodiment, the use of inverter 620 delays the switching of pass gates 310 and 319. This delay causes pass gate 317 to turn off before pass gate 310 turns on when the trigger signal switches from the second signal state to the first signal state. This ordering prevents the transmission of a signal at input 209 to output 208 when the trigger signal is in the first signal state. If the signal is allowed to be transmitted to output 208 when the trigger signal is in the first signal state, the circuit would no longer be a positive edge triggered device. The switching of pass gates 310 and 319 is also delayed from the switching of pass gate 519 to allow pass gate 519 to switch with pass gates 317. This ordering allows the contention caused by slave portion 206 during a switch in signal states of output 208 to be reduced as described above.

FIG. 7 illustrates in logic diagram form a fifth embodiment of the present invention. In this embodiment, one additional pass gate, pass gate 721 is coupled to inverter 311 and inverter 312. Another pass gate, pass gate 722 is coupled to inverter 313 and inverter 314. Pass gate 721 is coupled to inverter 318 and inverter 620 such that when the trigger signal is in the first signal state, pass gate 721 is OFF. Similarly, when the trigger signal is in the second signal state, pass gate 721 is ON. Because pass gate 310 is ON when the trigger signal is in the first signal state and OFF when the trigger signal is in the second signal state, pass gate 721 is OFF when pass gate 310 is ON and pass gate 721 is ON when pass gate 310 is OFF. Thus, when pass gate 310 is ON, pass gate 721 reduces contention between inverter 311 and inverter 312 thereby allowing signals to travel faster through master portion 205. When pass gate 310 is OFF, pass gate 721 allows inverter 311 and inverter 312 to act as front-to-back inverters thereby allowing them to perform their storage function. Likewise, when pass gate 319 is OFF, pass gate 722 is ON and when pass gate 319 is ON, pass gate 722 is OFF. Thus, when pass gate 319 is ON, pass gate 722 reduces the contention between inverter 313 and inverter 314. When pass gate 319 is OFF, pass gate 722 allows inverter 313 and inverter 314 to act as front-to-back inverters.

FIG. 8 illustrates in logic diagram form a sixth embodiment of the present invention. In this embodiment, bypass 207 comprises tri-state driver 823. Tri-state driver 823 is coupled to the output of inverter 318 and is controlled by the trigger signals. The input of tri-state driver 823 is coupled to master portion 205 and the output of tri-state driver 823 is coupled to output 208. When the trigger signal is in the second signal state, tri-state driver 823 acts as an inverter. However, when the trigger signal is in the first signal state, tri-state driver 823 is OFF and acts as an open circuit. In this embodiment, slave portion 206 also has a tri-state driver, tri-state driver 824. Here, tri-state driver 824 replaces pass gate 519 of previous embodiments. Tri-state driver 824 is coupled to the trigger line and the output of inverter 318. Tri-state driver 824 is controlled by the trigger signal. The input of tri-state driver 824 is coupled to inverters 313 and 314. The output of tri-state driver 824 is coupled to output 208. Like tri-state driver 823, when the trigger signal is in the first signal state, tri-state driver 824 acts as an inverter. On the other hand, when the trigger signal is in the second signal state, tri-state driver 824 is OFF and acts as an open circuit.

FIG. 9 illustrates in logic diagram form a seventh embodiment of the present invention. In this embodiment, bypass 207 comprises of AND gate 925. Slave portion 206 comprises of AND gate 926 and OR gate 927. AND gate 926 and OR gate 927 replace pass gate 519 of previous embodiments. The inputs of AND gate 925 is coupled to the trigger device and is also coupled to pass gate 310. The output of AND gate 925 is coupled to one input of OR gate 927. The inputs of AND gate 926 is coupled to inverter 318 and is also coupled to inverter 313. The output of AND gate 926 is coupled to the other input of OR gate 927. The output of OR gate 927 is coupled to output 208.

When the trigger device transmits a first trigger signal, AND gate 925 responds by transmitting a low signal state regardless of the signal received from master portion 205. On the other hand, AND gate 926 responds to a first trigger signal by transmitting a signal dependent on the signal state of the signal received from inverter 313. If the signal from inverter 313 is a low signal state, AND gate 926 will transmit a low signal state. If the signal from inverter 313 is a high signal state, AND gate 926 will transmit a high signal state. Since OR gate 927 receives a low signal state from AND gate 925, OR gate 927 will transmit the signal it receives from AND gate 926. If AND gate 926 transmits a low signal state, OR gate 927 will transmit a low signal state. If AND 926 transmits a high signal state, OR gate 927 will transmit a high signal state to output 208.

When the trigger device transmits a second trigger signal, AND gate 925 responds by transmitting a signal to OR gate 927 dependent on the signal received from master portion 205. If the signal received from master portion 205 is a low signal state, AND gate 925 will transmit a low signal state to OR gate 927. If the signal received from master portion 205 is a high signal state, AND gate 925 will transmit a high signal state to OR gate 927. On the other hand, AND gate 926 responds to a second trigger signal by transmitting a low signal state regardless of the signal received from inverter 313. Since OR gate 927 receives a low signal state from AND gate 926, OR gate 927 will transmit the signal received from AND gate 925 to output 208. If the signal received from AND gate 925 is a low signal state, OR gate 927 will transmit a low signal state to output 208. If the signal received from AND gate 925 is a high signal state, OR gate 927 will transmit a high signal state to output 208.

Thus, when the trigger device transmits a first trigger signal, the signal from inverter 313 appears on output 208. When the trigger device transmits a second trigger signal, the signal from master portion 205 appears on output 208.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

Thus, a novel master-slave flip-flop circuit has been described.

What is claimed is:

1. A fast master-slave flip-flop circuit, comprising:

a master portion including a first pass gate and front-to-back coupled first and second inverters, the first pass gate coupled to receive an input signal, the first pass gate passing the input signal in response to a first trigger signal, the first inverter coupled to receive the input signal from an output of the first pass gate;

a slave portion including a second pass gate, front-to-back coupled third and fourth inverters, a fifth inverter, and a fourth pass gate, the second pass gate coupled to receive the input signal from an output of the first inverter, the second pass gate passing the input signal from the first inverter in response to a second trigger signal, the third inverter coupled to receive the input signal from an output of the second pass gate, the fifth inverter coupled to receive the input signal from an output of the third inverter, the fourth pass gate coupled receive the input signal from an output of the fifth inverter, the fourth pass gate passing the input signal in response to the first trigger; and a bypass portion directly coupled to the output of the first pass gate, the fast master-slave flip-flop circuit transmitting the input signal from the first pass gate through the bypass portion in response to the second trigger signal, the input signal being transmitted directly through the bypass portion without a gate delay associated with the first and second inverters, the fourth pass gate and the bypass portion being simultaneously triggered by the first and second trigger signals respectively in alternating fashion when transmitting the input signal.

2. The faster master-slave flip-flop circuit described in claim 1 wherein a transistor of the third and fourth inverters has a slower speed requirement than a corresponding transistor of the first and second inverters.

3. The fast master-slave flip-flop circuit described in claim 2 wherein the transistor of the third and fourth inverters occupies less area on a semiconductor chip than the corresponding transistor of the first and second inverters.

4. The fast master-slave flip-flop circuit described in claim 2 wherein the transistor of the third and fourth inverters consumes less power than the corresponding transistor of the first and second inverters.

5. The fast master-slave flip-flop circuit described in claim 1 wherein the bypass portion comprises:

a sixth inverter directly coupled to the output of the first pass gate; and a third pass gate coupled to receive the input signal from an output of the sixth inverter, the third pass gate passing the input signal in response to second trigger signal.

6. The fast master-slave flip-flop circuit described in claim 1 further comprising:

a fifth pass gate included in the master portion coupled between an output of the second inverter and an input of the first inverter, the fifth pass gate passing the input signal in response to the second trigger signal; and a sixth pass gate included in the slave portion coupled between an output of the fourth inverter and an input of the third inverter, the sixth pass gate passing the input signal in response to the first trigger signal.

7. The fast master-slave flip-flop circuit described in claim 1 wherein the fifth inverter and the fourth pass gate are included in a first tri-state inverter, the first tri-state inverter passing the input signal in response to the first trigger signal, the bypass circuit comprising a second tri-state inverter directly coupled to the output of the first pass gate, the second tri-state inverter transmitting the input signal in response to the second trigger signal.

8. A fast master-slave flip-flop circuit, comprising:

a master portion including a first pass gate and front-to-back coupled first and second inverters, the first pass gate coupled to receive an input signal, the first pass gate passing the input signal in response to a first trigger signal, the first inverter coupled to receive the input signal from an output of the first pass gate;

a slave portion including a second pass gate, front-to-back coupled third and fourth inverters and a first AND gate, the second pass gate coupled to receive the input signal from an output of the first inverter, the second pass gate passing the input signal from the first inverter in response to a second trigger signal, the third inverter coupled to receive the input signal from an output of the second pass gate, the first AND gate coupled to receive the input signal from an output of the third inverter, the first AND gate further coupled to receive the first trigger signal;

a bypass portion directly coupled to the output of the first pass gate, the fast master-slave flip-flop circuit transmitting the input signal from the first pass gate through the bypass portion in which the bypass portion being simultaneously triggered in alternating fashion with the first AND gate, the input signal being transmitted directly through the bypass portion without a gate delay associated with the first and second inverters; and an OR gate coupled to receive the input signal from an output of the first AND gate and an output of the bypass portion.

9. The faster master-slave flip-flop circuit described in claim 8 wherein a transistor of the third and fourth inverters has a slower speed requirement than a corresponding transistor of the first and second inverters.

10. The fast master-slave flip-flop circuit described in claim 9 wherein the transistor of the third and fourth inverters occupies less area on a semiconductor chip than the corresponding transistor of the first and second inverters.

11. The fast master-slave flip-flop circuit described in claim 9 wherein the transistor of the third and fourth inverters consumes less power than the corresponding transistor of the first and second inverters.

12. The fast master-slave flip-flop circuit described in claim 8 wherein the bypass portion comprises a second AND gate directly coupled to receive the output of the first pass gate.

13. The fast master-slave flip-flop circuit described in claim 8 further comprising:

a third pass gate included in the master portion coupled between an output of the second inverter and an input of the first inverter, the third pass gate passing the input signal in response to the second trigger signal; and a fourth pass gate included in the slave portion coupled between an output of the fourth inverter and an input of the third inverter, the fourth pass gate passing the input signal in response to the first trigger signal.

* * * * *

UNITED STATES PATENT AND TRADEMARK OFFICE
CERTIFICATE OF CORRECTION

PATENT NO. : 5,656,962
DATED : August 12, 1997
INVENTOR(S) : Jashojiban Banik

It is certified that error appears in the above-identified patent and that said Letters Patent is hereby corrected as shown below:

In column 1 at line 19 delete "docked" and insert --clocked--

In column 1 at line 20 delete "docked" and insert --clocked--

In column 1 at line 23 delete "docking" and insert --clocking--

In column 4 at line 67 delete "dock" and insert --clock--

Signed and Sealed this

Sixth Day of January, 1998

Attest:

BRUCE LEHMAN

*Attesting Officer*   *Commissioner of Patents and Trademarks*